United States Patent

Bryden

[15] 3,699,361

[45] Oct. 17, 1972

[54] SUB-NANOSECOND PULSE GENERATOR CIRCUIT

[72] Inventor: Brian Richard Bryden, Kanata, Ontario, Canada

[73] Assignee: Northern Electric Company Limited, Montreal, Quebec, Canada

[22] Filed: Sept. 23, 1971

[21] Appl. No.: 183,178

[52] U.S. Cl. ....................307/273, 307/260, 307/290

[51] Int. Cl. ...........................H03k 3/284, H03k 3/29

[58] Field of Search......307/260, 265, 268, 269, 273, 307/290

[56] References Cited

UNITED STATES PATENTS 3,205,372 9/1965 Pacl, Jr. .................307/290 X 3,584,241 6/1971 Nakamura.................307/290

*Primary Examiner*—Stanley D. Miller, Jr.

*Attorney*—John E. Mowle

[57] ABSTRACT

A transistorized sub-nanosecond pulse generator circuit having a pair of emitter coupled transistors in a monostable multivibrator configuration. By selecting an interstage capacitor, a collector load resistor, and a base bias or dividing resistor, in accordance with developed formulas, the operation of the transistorized pulse generator may effectively match the operation of conventional step-recovery-diode pulse generator circuits.

2 Claims, 2 Drawing Figures

SUB-NANOSECOND PULSE GENERATOR CIRCUIT

FIELD OF THE INVENTION

This invention relates to a sub-nanosecond transistorized pulse generator circuit.

DESCRIPTION OF THE PRIOR ART

In high speed pulse code modulation transmission circuits, step recovery diodes are generally used in high speed regenerators to generate sub-nanosecond width sampling pulses which are difficult to generate by other means.

These step recovery diode circuits have several disadvantages, chiefly among these are: high excitation power requirements, non-linear impedance presented to the driving source, poor stability of pulse height and position with respect to temperature and drive signal variations, and a general need to attenuate the output power fed to the following stage.

A reference to the use of step recovery diodes may be found in the following publication by I. Dorros; J.M. Sipress; and F.D. Waldhauer, entitled "An Experimental 224 Mb/s Digital Repeatered Line," Bell Systems Technical Journal, 45, September 1966, pp. 993–1,043.

SUMMARY OF THE INVENTION

A transistorized circuit using two transistors and several passive components, which does not exhibit many of the disadvantages of step recovery diode pulse generators, has been found to perform the tasks performed by step recovery diode pulse generator circuits. This transistorized pulse generator circuit requires very little driving power, particularly as its input impedance is largely dependent on linear passive components connected across its input. In addition this transistorized generator operates over a wide range of signal inputs with little degredation of the output pulse shape or position as said generator is sensitive primarily to the zero crossings of the input voltage waveform. The transistorized generator circuit has a temperature stability which is superior to that of conventional step recovery diode circuits, a circuit characteristic which is attributable in part to the use of emitter coupled transistors. The transistorized generator circuit has another unusual circuit characteristic in that its output current pulse driving operation exceeds the quiescent current flowing through an emitter resistor which provides the necessary common emitter coupling. Furthermore as the output level of the transistor pulse generator is controlled by passive components, the output level can be readily adjusted to provide an output signal and circuit impedance compatible with following circuitry.

Thus in accordance with the present invention the transistorized pulse generator circuit comprises a first and a second transistor with the emitters of said transistors connected to a first source of potential through a common emitter resistor. The base of the first transistor is connected to an input terminal through an input coupling capacitor, and to a second source of potential through a base resistor. The collector of the first transistor is connected through a collector load resistor to a third source of potential, and said collector is also connected to the base of the second transistor through an interstage capacitor. The collector of the second transistor is connected through an inductor to the third source of potential, and through an output coupling capacitor to a load. The base of the second transistor is connected through a first dividing resistor to the third source of potential and through a second dividing resistor to the second source of potential.

The selection of the interstage capacitor, the collector load resistor, and the second dividing resistor is determined from the following equations:

$$r_{bb'} \leq R_1 || R_3 \leq \frac{r_{bb'}}{r_{bb'}[3\pi f_t(2C_n + C_{b'c})] - 1} \quad (1)$$

$$C_1 \geq \frac{1}{\pi f_t R_1 \sqrt{4 - \left(\frac{1 + R_{bb'}}{R_1}\right)^2}} \quad (2)$$

$$\frac{1}{2\pi\sqrt{L_s C_s}} = f_{res} > f_0 \quad (3)$$

where:

$R_1$ is the resistance in ohms of the collector load resistor of the first transistor $R_3$ is the resistance in ohms of the second dividing resistor $C_1$ is the low frequency capacitance in farads of the interstage capacitor $C_h$ is the transistor header capacitance in farads measured between base and collector $L_s$ is the series inductance in henries of the interstage capacitor $C_s$ is the series capacitance in farads of the interstage capacitor at the self resonant frequency $f_{RES}$. At low frequencies $C_s$ is approximately equal to $C_1$.

$f_t$ is the current gain bandwidth figure of the second transistor (the frequency at which the short circuit collector current gain from base to collector equals unity)

$r_{bb'}$ is the internal base spreading resistance in ohms of the second transistor when said transistor is represented by a hybrid $\pi$ equivalent circuit $C_{b'c}$ is the capacitance in farads between the internal base $_{b'}$ and the collector of the transistor when said transistor is represented by the hybrid $\pi$ equivalent circuit $f_o$ is the frequency at which the loop circuit gain from the collector of the first transistor through the base and emitter of the second transistor, through the emitter of the first transistor and back to the collector of the first transistor has a value of unity (loop A,B,C in FIG. 2)

$f_{RES}$ the self resonant frequency of the interstage capacitor $C_s$.

BRIEF DESCRIPTION OF THE DRAWINGS

An example embodiment of the invention will now be described with reference to the accompanying drawings in which.

DESCRIPTION OF THE PREFERRED EMBODIMENT

Figure 1:
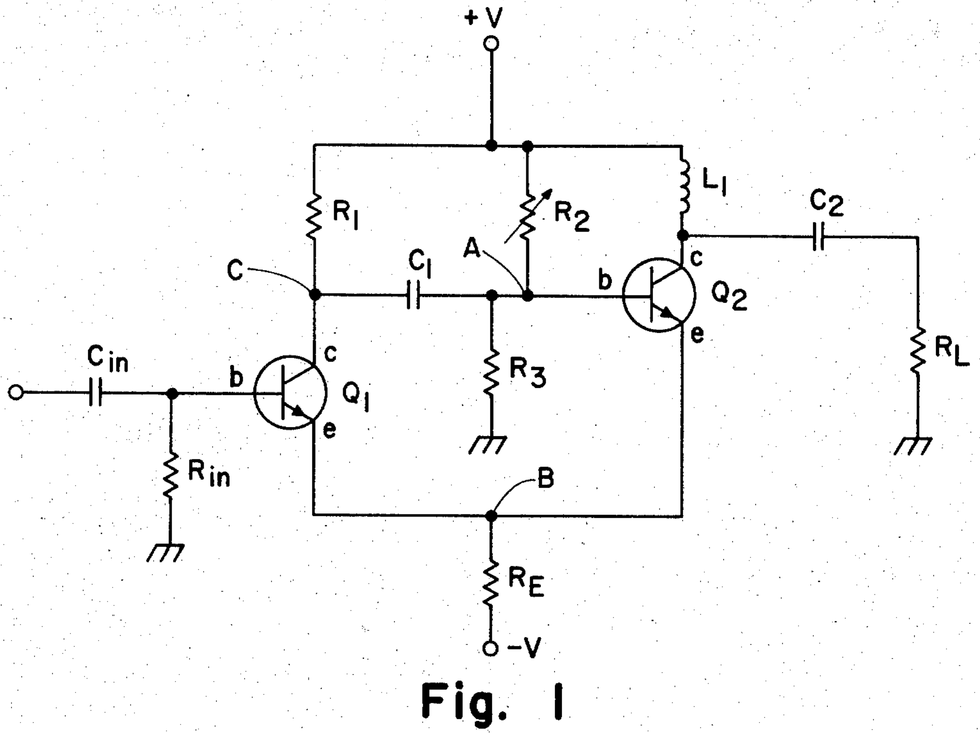
FIG. 1 is a schematic drawing of a transistorized pulse generator circuit.

As illustrated in FIG. 1 the transistorized pulse generator circuit comprises first $Q_1$ and a second $Q_2$ transistors with their emitters connected together. The junction of the emitters of the first $Q_1$ and a second $Q_2$ transistors is connected through an emitter resistor RE, to a first source of potential −V. The collector of the transistor $Q_1$ is coupled to the base of the second transistor $Q_2$ through an interstage capacitor $C_1$. A collector load resistor $R_1$ connects the collector of the first transistor $Q_1$ to a third source of potential +V, while an inductor $L_1$ connects the collector of the second transistor $Q_2$ to said third source of potential +V. The base of the first transistor $Q_1$ is connected, to a second source of potential (ground) and through a capacitor $C_{in}$ to an external driving circuit (the external driving circuit is not shown).

A load $R_L$, illustrated schematically as a resistor in FIG. 1, is connected to the second source of potential (ground) and is coupled to the collector of the second transistor $Q_1$ through a coupling capacitor $C_2$.

To provide for suitable biasing of the first $Q_1$ and second $Q_2$ transistors, the base of the first transistor $Q_1$, is connected through a first dividing resistor $R_2$ to the third source of potential +V, and through a second dividing resistor $R_3$ to the second source of potential (ground).

Figure 2:
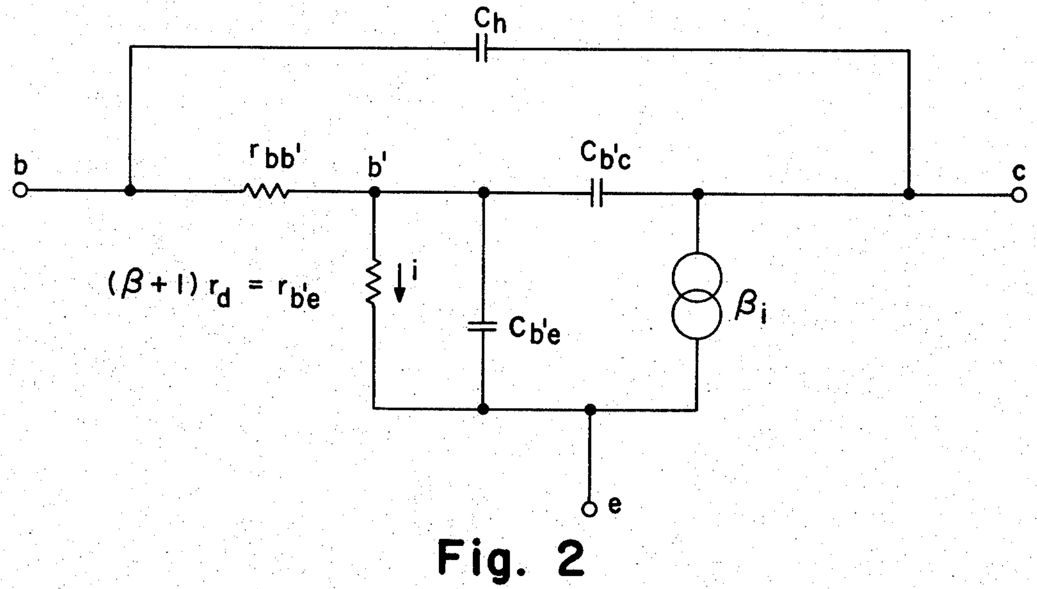
FIG. 2 is a schematic drawing of a hybrid $\pi$ equivalent circuit of a transistor. This hybrid $\pi$ equivalent circuit is used to represent the transistors illustrated in FIG. 1.

In order to develop the equations which define the limits on the various elements ($R_1$, $R_3$, $C_1$) of the circuit illustrated schematically in FIG. 1, the first $Q_1$ and second $Q_2$ transistors were represented by their hybrid $\pi$ equivalent circuits. The hybrid $\pi$ equivalent circuit used for the first $Q_1$ and second $Q_2$ transistors representations is illustrated in FIG. 2. A similar hybrid $\pi$ equivalent circuit may be found in the following book "Introduction to Semiconductor Circuit Design" by David J. Comer, Addison Wesley Publishing Company, p.p. 174 et seq.

With reference to FIG. 2 it can be seen that the hybrid $\pi$ equivalent circuit comprises a resistive element $r_{b'b}$ which is commonly referred to as the internal base spreading resistance, a capacitive element $C_h$ which represents the header capacitance of the transistor measured between base $b$ and collector c, and a capacitive element $C_{b'c}$ which represents the capacitance between the virtual or internal base $b'$ and the collector c of the transistor. The other equivalent circuit elements illustrated in FIG. 2 ($C_{b'e}$, $\beta_i$, $r_{b'e}$) do not appear in the developed equations but may be found in the Comer reference.

In addition to the hybrid $\pi$ parameters of the transistors $Q_1$ and $Q_2$ which are illustrated schematically in FIG. 2, the current gain bandwidth figure or $f_t$, and the short circuit current gain or $\beta$ of the transistors $Q_1$ and $Q_2$ are taken into account in the design of a pulse generator in accordance with the present invention.

As the hybrid $\pi$ equivalent circuit, and as the various other transistor parameters referred to in the foregoing description are well known, no further explanation is believed necessary.

With reference to FIG. 1, the collector load resistor $R_1$, the second dividing resistor $R_3$, and the interstage capacitor $C_1$ are elements which greatly determine the upper frequency operating limit of the pulse generator. It has been found as one step in realizing the pulse generator, that the effective parallel resistance of the collector load resistance $R_1$ and the second dividing resistance $R_3$ (written algebraically as $R_1 || R_3$) can be related to the base spreading resistance $r_{bb'}$ of the second transistor $Q_2$ by the following equation (Equation (1)):

$$r_{bb'} \leq R_1 || R_3 \leq \frac{r_{bb'}}{r_{bb'}[3\pi f_t(2C_h + C_{b'c})]-1} \quad (1)$$

In addition, as a further step in realizing pulse generator performance in accordance with the invention, the interstage capacitor should have a minimum capacitance given by the following equation (Equation (2)):

$$C_1 = \frac{1}{R_1 \pi f_t \sqrt{4-\left(1+\frac{r_{bb'}}{R_1}\right)2}} \quad (2)$$

Although there is apparently no theoretical upper limit on the capacitance of the interstage capacitor $C_1$, a practical upper limit is imposed by the series self resonant frequency $f_{RES}$ of the capacitor $C_1$. This interstage capacitor $C_1$ should be chosen in accordance with the following equation (Equation (3)):

$$f_{RES} = 2\pi \frac{1}{\sqrt{L_s C_s}} > f_0 \quad (3)$$

In a typical circuit having a rise time of the order of 200 picoseconds (and shown schematically in FIG. 1) the following component values were used:

| | | |
|---|---|---|
| $Q_1$ and $Q_2$ | 2N5652 | |
| $C_1$ | 10pf | (picofarads) |
| $R_3$ | 50Ω | (ohms) |
| $R_1$ | 100Ω | (ohms) |
| $L_1$ | 55nh | (nanohenries) |
| $C_{in}$ | .1μf | (microfarads) |
| $C_2$ | .1μf | (microfarads) |
| $R_E$ | 430Ω | (ohms) |
| $R_{in}$ | 50Ω | (ohms) |
| $R_2$ | 1kΩ to 2kΩ | (ohms) |

For a 2N5652 transistor $Q_2$ the base spreading resistance $r_{b'b}$ is approximately 20 ohms, the header capacitance $C_h$ is approximately 0.3pf, the capacitance $C_{b'c}$ is approximately 0.4pf, and the current gain bandwidth figure $f_t$ is approximately 2.5 Ghz (Gigahertz).

Using the parameters for the 2N5652 transistor as outlined above, the lower and upper limits of $R_1 || R_3$ can be calculated from Equation (1). (the lower limit is $r_{bb'}$ or 20Ω, while the upper limit approaches infinity). The upper bound for $R_1 || R_3$ in this example (with $r_{bb}$ =20Ω) is not limited by Equation (1), (calculated resistance for $R_1 || R_3$ is infinity), but by other considerations such as biasing and transistor thermal stability. The resistance of $R_1 || R_3$ for the typical circuit which uses an $R_1$ of 100 ohms and an $R_3$ of 50 ohms is approximately 33 ohms.

The lower capacitance limit of the interstage coupling capacitor $C_1$ as calculated from Equation (2) yields a value of 0.8pf and as calculated from Equation (5) yields a value of 1.06pf. The nominal value of $C_1$ as used in a typical circuit is 10pf.

The series self resonant frequency $f_{RES}$ was calculated from Equation (3) and a capacitor was chosen for $C_1$ which had a self resonant frequency $f_{RES}$ greater than $f_o$(Ghz).

Using the following Equation (6):

$$\frac{2\pi f_t C_1}{r_{bb'}}=\frac{R_3+r_{bb'}}{R_1 R_3 r_{bb'}}+j\,\frac{2\pi f_0(C_1+C_h)}{R_1}+j2\pi f_0 C_1\left(\frac{R_3+r_{bb'}}{R_3 r_{bb'}}+j2\pi f_0 C_h\right) \qquad (6)$$

and the aforelisted values for a typical circuit using 2N5652 transistors, $f_o$ was calculated as 1.5Ghz.

The various terms of Equation (6) have been previously defined. In one application a nominal capacitance of 10pf and a self resonant frequency $f_{RES}$ of 1.6 Ghz was chosen for $C_1$. As 1.6 Ghz>1.5 Ghz Equation (3) is satisfied.

Although in the preferred embodiment and in the preceeding example transistors $Q_1$ and $Q_2$ are shown as npn types, pnp type transistors with suitable characteristics could be substituted provided the polarity of the first and third source are reversed. Additionally, the first transistor $Q_1$ and the second transistor $Q_2$ need not have the same transistor code.

The operation of the preferred embodiment of the pulse generator when a suitable load resistor $R_L$ or other terminating impedance is connected to the output will now be described with reference to FIG. 1.

After the first dividing resistor $R_2$ is adjusted or selected, such that the first transistor $Q_1$ is in its non-conducting state, an input signal with a suitable waveform, is applied to the base of the first transistor $Q_1$ through the input capacitor $C_{in}$. For simplicity of explanation the input waveform will be assumed to be sinusoidal in form.

When the input signal waveform swings positive with respect to the second source of potential (ground), the first transistor $Q_1$ is turned ON and the second transistor $Q_2$ is turned OFF such that the voltage at the collector of the second transistor $Q_2$ rises to the value of the third source of potential +V. This positive swing of the input signal waveform referred to above is the positive zero crossing of the sinusoidal input signal waveform. At the negative zero crossing of the sinusoidal input waveform, the second transistor $Q_2$ quickly turns ON and a rapid current change flows from the second source of potential (ground), through the load resistor $R_L$, the output capacitor $C_2$, the second transistor $Q_2$, and the emitter resistor $R_E$, to the first source of potential −V. The presence of the conductor $L_1$ in series with the collector of the second transistor $Q_2$ and the third source of potential forces this rapid change of current to pass through the load $R_L$. Unlike the voltage waveform which occurs at the collector of the second transistor $Q_2$ at the positive zero crossing of the input signal waveform, the negative zero crossing of the input signal waveform is responsible for a large sharp negative spike at the collector of the second transistor $Q_2$. This large sharp negative spike has very steep sides (short rise and fall times) and is the desired output signal from the transistorized pulse generator circuit. The extraordinary behavior of this circuit (its maximum operating frequency is approximately ten times the maximum toggle rate of an equivalent multivibrator circuit) results of the advantageous use of the non linear operation of the transistors by selecting $R_1$ $R_3$ and $C_1$ as defined in the preceeding equations (Equations (1) to (3) inclusive).

The base resistor $R_{in}$ is chosen to provide a suitable terminating impedance (approximately 50Ω), for the driving circuit (not shown), while the input $C_{in}$ and output $C_2$ capacitors are chosen to present minimum impedance to signal input current and output load current within the range of operating frequencies.

What is claimed is:

1. A sub-nanosecond pulse generator circuit comprising:

a. first and second transistors, the emitters of said transistors being connected together;

b. an emitter resistor for connecting said emitters to a first source of potential;

c. an input coupling capacitor for connecting an input terminal to the base of the first transistor;

d. a base resistor for connecting the base of the first transistor to a second source of potential;

e. a collector load resistor for connecting the collector of the first transistor to a third source of potential;

f. an inductor connecting the collector of the second transistor to the third source of potential;

g. an output coupling capacitor for connecting the collector of the second transistor to a load;

h. a first dividing resistor for connecting the base of the second transistor to the third source of potential and a second dividing resistor for connecting the base of the second transistor to the second source of potential;

i. an interstage capacitor connecting the collector of the first transistor to the base of the second transistor;

wherein the resistance of the parallel combination of the collector load resistor and the second dividing resistor is given by the following equation $$r_{bb'}\leq R_1||R_3\leq\frac{r_{bb'}}{r_{bb'}[(3\pi f_t 2C_h+C_{b'c})]-1} \qquad (1)$$

wherein the interstage capacitor has a minimum capacitance given by the following equation $$C_1=\frac{1}{\pi f_t R_1\sqrt{4-\left(1+\frac{r_{bb'}}{R_1}\right)^2}} \qquad (2)$$

and wherein the interstage capacitor has a series self resonant frequency given by the following equation $$\frac{1}{2\pi\sqrt{L_s C_s}}=f_{RES}>f_0 \qquad (3)$$

where:

| | |
|---|---|
| $R_1$ | is the resistance in ohms of the collector load resistor of the first transistor |
| $R_3$ | is the resistance in ohms of the second dividing resistor |
| $C_1$ | is the low frequency capacitance in farads of the interstage capacitor |
| $C_h$ | is the transistor header capacitance in farads measured between base and collector |
| $L_s$ | is the series inductance in henries of the interstage capacitor. |

| | |
|---|---|
| $C_s$ | is the series capacitance in farads of the interstage capacitor at the self resonant frequency $f_{RES}$. At low frequencies $C_s$ is approximately equal to $C_1$. |
| $f_t$ | is the current gain bandwidth figure of the second transistor (the frequency at which the short circuit collector current gain from base to collector equals unity) |
| $r_{bb'}$ | is the internal base spreading resistance in ohms of the second transistor when said transistor is represented by a hybrid $\pi$ equivalent circuit |
| $C_{b'c}$ | is the capacitance in farads between the internal base $_{b'}$ and the collector of the transistor when said transistor is represented by the hybrid $\pi$ equivalent circuit |
| $f_o$ | is the frequency at which the loop current gain from the collector of the first transistor through the base and emitter of the second transistor, through the emitter of the first transistor and back to the collector of the first transistor has a value of unity (loop A,B,C, in FIG. 2) |
| $f_{RES}$ | the self resonant frequency of the interstage capacitor $C_s$. |

2. The invention as defined in claim 1 wherein the resistance of the parallel combination of the collector load resistor and the second dividing resistor is given by the following equation:

$$2r_{bb'} \leqq R_1 || R_3 \leqq \frac{r_{bb'}}{r_{bb'}[4\pi f_t(2C_h + C_{b'o})] - 1} \qquad (4)$$

and wherein the interstage capacitor has a minimum capacitance given by the following equation $$C_1 \geqq \frac{3}{4\pi R_1 f_t \sqrt{\frac{9}{4} - \left(1 + \frac{r_{bb'}}{R_1}\right)^2}} \qquad (5)$$

* * * * *